(12) United States Patent
Ramachandran et al.

(10) Patent No.: US 7,439,487 B2
(45) Date of Patent: Oct. 21, 2008

(54) OPTICAL ENCODER APPARATUS FOR REMOVABLE CONNECTION WITH A PRINTED CIRCUIT BOARD AND METHODS OF ASSEMBLING OPTICAL ENCODER APPARATUS.

(75) Inventors: Premkumar S. Ramachandran, Perak (MY); Yee-Loong Chin, Perak (MY); Saifulbahari Saidan, Penang (MY)

(73) Assignee: Avago Technologies General IP (Singapore) Pte Ltd, Singapore (SG)

( * ) Notice: Subject to any disclaimer, the term of this patent is extended or adjusted under 35 U.S.C. 154(b) by 116 days.

(21) Appl. No.: 11/394,611

(22) Filed: Mar. 31, 2006

(65) Prior Publication Data
US 2007/0228265 A1 Oct. 4, 2007

(51) Int. Cl.
*H01L 31/153* (2006.01)
*G01D 5/34* (2006.01)

(52) U.S. Cl. ............... 250/231.13; 250/239; 257/81; 257/777

(58) Field of Classification Search ............ 250/231.13, 250/239; 257/80–82, 84, 433, 687, 777–778; 385/53, 88, 92
See application file for complete search history.

(56) References Cited

U.S. PATENT DOCUMENTS

| | | | |
|---|---|---|---|
| 6,135,786 A * | 10/2000 | Johnson et al. | 439/76.1 |
| 6,371,370 B2 | 4/2002 | Sadler et al. | |
| 6,623,179 B2 | 9/2003 | Hurt et al. | |
| 6,700,138 B2 | 3/2004 | Crane, Jr. et al. | |
| 6,784,464 B2 | 8/2004 | Ichikawa et al. | |
| 6,821,027 B2 * | 11/2004 | Lee et al. | 385/89 |
| 6,966,623 B2 | 11/2005 | Fo et al. | |

FOREIGN PATENT DOCUMENTS

JP 10041540 2/1998

\* cited by examiner

*Primary Examiner*—Kevin Pyo

(57) ABSTRACT

There is disclosed optical encoder apparatus for removable connection with a printed circuit board. In an embodiment, the apparatus includes a light emitting component, a light detecting component, a mounting component for attaching the light emitting component thereon, and another mounting component for attaching the light detecting component thereon, wherein each of the mounting components have a removable connection with the printed circuit board. A method of assembling optical encoder apparatus is disclosed. In an embodiment, the method includes attaching a light emitting component and a terminal of a first mounting component to one another; attaching a light detecting component and a terminal of a second mounting component to one another; attaching a terminal of the first mounting component to a printed circuit board; and attaching a terminal of the second mounting component to the printed circuit board. Other embodiments are also disclosed.

20 Claims, 10 Drawing Sheets

OPTICAL ENCODER APPARATUS FOR REMOVABLE CONNECTION WITH A PRINTED CIRCUIT BOARD AND METHODS OF ASSEMBLING OPTICAL ENCODER APPARATUS.

BACKGROUND

Generally, optical encoder apparatus include a single modular component having a light emitting portion and a light detecting portion. This single modular component may be attached to a printed circuit board. However, once the modular component is attached to the printed circuit board, the resolution of the light detection may not be adjusted.

Furthermore, light may be transmitted directly from the light emitting portion to the light detecting portion of the optical encoder apparatus. This cross-talk can induce error in the optical encoder apparatus.

SUMMARY OF THE INVENTION

In an embodiment, there is provided optical encoder apparatus for removable connection with a printed circuit board, the apparatus comprising a light emitting component having an outer surface with a conductive terminal; a light detecting component having an outer surface with a conductive terminal; a first mounting component having a surface for attaching the outer surface of the light emitting component thereon, a first conductive terminal for electrical connection with the conductive terminal of the light emitting component, and a second conductive terminal for removable connection with the printed circuit board; and a second mounting component having a surface for attaching the outer surface of the light detecting component thereon, a first conductive terminal for electrical connection with the conductive terminal of the light detecting component, and a second conductive terminal for removable connection with the printed circuit board.

In another embodiment, there is provided optical encoder apparatus for removable connection with a printed circuit board, the apparatus comprising a light emitting component having an outer surface with a conductive terminal; a light detecting component having an outer surface with a conductive terminal; a mounting component having a surface for attaching the outer surface of the light emitting component and the outer surface of the light detecting component thereon, a first set of conductive terminals for electrical connection with the conductive terminal of the light emitting component and with the conductive terminal of the light emitting component, and a second set of conductive terminals for removable connection with the printed circuit board.

In yet another embodiment, there is provided optical encoder apparatus for removable connection with a printed circuit board, the apparatus comprising a light emitting component having an outer surface with a conductive terminal; a light detecting component having an outer surface with a conductive terminal; a mounting component having a surface for attaching the outer surface of the light emitting component and the outer surface of the light detecting component thereon, a first set of conductive terminals for electrical connection with the conductive terminal of the light emitting component and with the conductive terminal of the light emitting component, and a second set of conductive terminals for removable connection with the printed circuit board.

In still another embodiment, there is provided a method of assembling optical encoder apparatus, the method comprising attaching a conductive terminal of a light emitting component and a first conductive terminal of a first mounting component to one another; attaching a conductive terminal of a light detecting component and a first conductive terminal of a second mounting component to one another; attaching a second conductive terminal of the first mounting component to a printed circuit board; and attaching a second conductive terminal of the second mounting component to the printed circuit board.

In another embodiment, there is provided a method of assembling optical encoder apparatus, the method comprising attaching a conductive terminal of a light emitting component and a first conductive terminal of a mounting component to one another; attaching a conductive terminal of a light detecting component and a second conductive terminal of the mounting component to one another; and attaching a third conductive terminal and a fourth conductive terminal of the mounting component to a printed circuit board, wherein the first conductive terminal and the third conductive terminal are in electrical connection with one another, and wherein the second conductive terminal and the fourth conductive terminal are in electrical connection with one another.

Other embodiments are also disclosed.

BRIEF DESCRIPTION OF THE DRAWINGS

Illustrative embodiments of the invention are illustrated in the drawings, in which.

DETAILED DESCRIPTION OF AN EMBODIMENT

In an embodiment, the optical encoder apparatus may allow adjustment of the level of resolution without changing the main printed circuit board.

In one embodiment, the optical encoder apparatus may have increased performance as the LED and detector may be assembled together from separate components, and a blocking portion may be provided to prevent crosstalk between the LED and detector.

Figure 1:
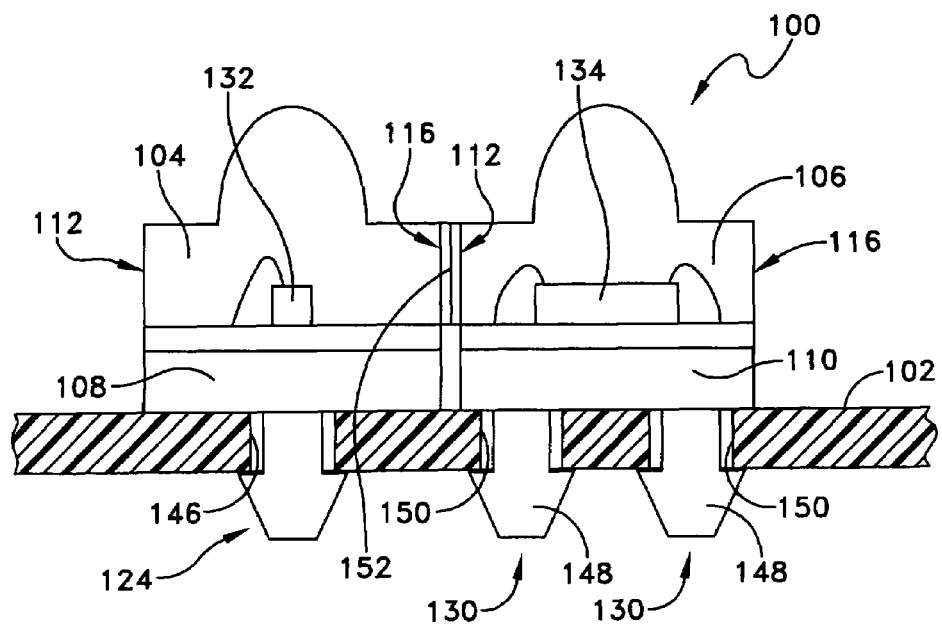
FIG. 1 illustrates an embodiment of an optical encoder apparatus having a light detecting component configured for removable connection with a printed circuit board.

Referring to FIG. 1, there is shown an optical encoder apparatus 100 for removable connection with a printed circuit board 102. In an embodiment, apparatus 100 may include a light emitting component 104, a light detecting component 106, a first mounting component 108, and a second mounting component 110.

Figure 2:
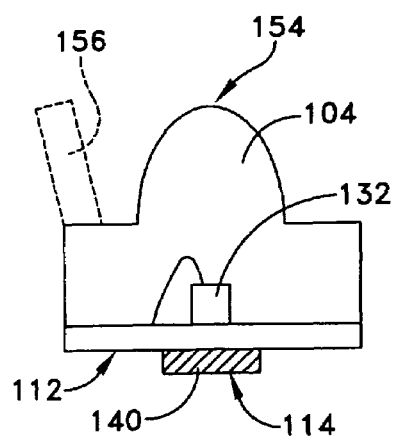
FIG. 2 illustrates a light emitting component of the apparatus shown in FIG. 1.

Looking at FIG. 2, there is shown light emitting component 104 having an outer surface 112 with a conductive terminal 114.

Figure 3:
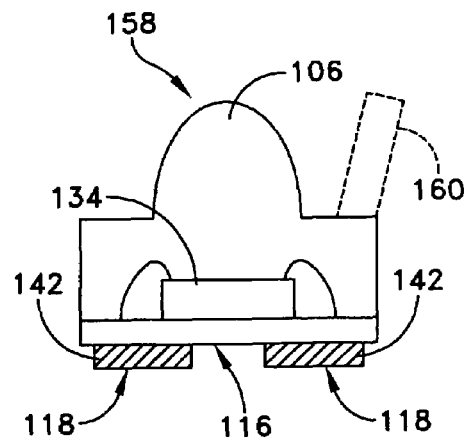
FIG. 3 illustrates a light detecting component of the apparatus shown in FIG. 1.

Looking at FIG. 3, there is shown light detecting component 106 having an outer surface 116 with a pair of conductive terminals 118. In another embodiment, light detecting component 106 may have a single conductive terminal 118 or multiple conductive terminals 118.

Figure 4:
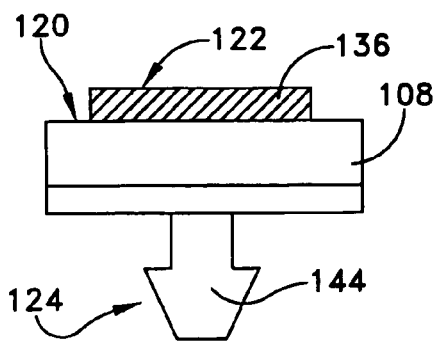
FIG. 4 illustrates a first mounting component of the apparatus shown in FIG. 1.

Looking at FIG. 4, there is shown first mounting component 108 having a surface 120 for attaching outer surface 112 of light emitting component 104 (FIG. 2) thereon. In an embodiment, first mounting component 108 may include a first conductive terminal 122 and a second conductive terminal 124. First conductive terminal 122 may be configured for electrical connection with conductive terminal 114 of light emitting component 124 (FIG. 2). Second conductive terminal 104 may be configured for removable connection with printed circuit board 102 (FIG. 1).

Figure 5:
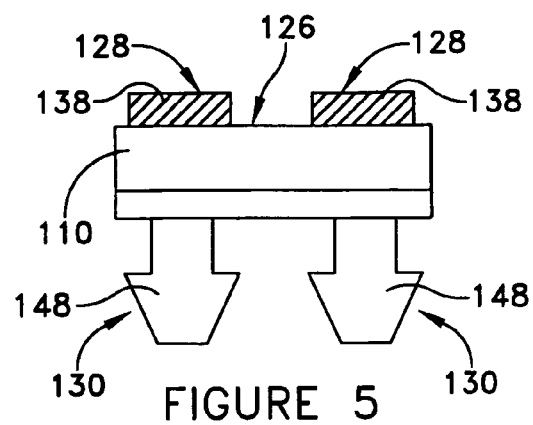
FIG. 5 illustrates a second mounting component of the apparatus shown in FIG. 1.

Looking at FIG. 5, there is shown second mounting component 110 having a surface 126 for attaching outer surface 116 of the light detecting component 106 (FIG. 3) thereon. In an embodiment, second mounting component 110 may include a first pair of conductive terminal 128 and a second conductive terminal 130. First pair of conductive terminals 128 may be configured for electrical connection with the pair of conductive terminals 118 of light detecting component 106. In an alternative embodiment, a single conductive terminal 128 or multiple conductive terminals 128 may be provided. Second conductive terminal 130 may be configured for removable connection with printed circuit board 102.

Referring now to FIGS. 1 and 2, and in an embodiment, light emitting component 104 may include a light emitting diode 132. Outer surface 112 of light emitting component 104 may be a modular component containing light emitting diode 132.

Referring now to FIGS. 1 and 3, and in an embodiment, light detecting component 106 may include a detector 134, which may include, but is not limited to, a photodiode 134. Outer surface 116 of light detecting component may be a modular component containing photodiode 134.

Looking at FIG. 1, there is shown light emitting component 106 with light emitting diode 132, outer surface 112 of the light emitting component 104 is a modular component containing light emitting diode 132, the light detecting component 106 with photodiode 134, and wherein outer surface 116 of light detecting component 106 is a modular component containing photodiode 134.

Referring still to FIGS. 1-5, there is shown optical encoder apparatus 100 (FIG. 1) having first mounting component 108 (FIGS. 1 and 4) and second mounting component 110 (FIGS. 1 and 5) as separate modular components from light emitting component 104 (FIGS. 1 and 2) and light detecting component 106 (FIGS. 1 and 3), respectively.

Looking again at FIG. 4, and in one embodiment, surface 120 of first mounting component 108, which is configured for attaching light emitting component 104 thereon, may include a solder material 136.

Looking again at FIG. 5, and in one embodiment, surface 126 of second mounting component 110, which is configured for attaching light detecting component 106 thereon, may include a solder material 138.

Referring to FIG. 2, and in an embodiment, outer surface 112 of light emitting component 104 may include a solder material 140.

Referring to FIG. 3, and in an embodiment, outer surface 116 of light detecting component 106 may include a solder material 142.

Looking at FIGS. 1 2 and 4, and in one embodiment, surface 120 of first mounting component 108, which may be configured for attaching the light emitting component 104 thereon, may include solder material 136. Outer surface 112 of light emitting component may also include solder material 140. Solder material 136 of first mounting component 108 and solder material 140 of light emitting component may attach first mounting component 108 and light emitting component 104 to one another.

Looking still at FIGS. 1, 3 and 5, and in one embodiment, surface 126 of second mounting component 110, which may be configured for attaching light detecting component 106 thereon, may include solder material 138. Outer surface 116 of light detecting component 106 may include solder material 142. Solder material 138 of second mounting component 110 and solder material 142 of light detecting component 106 may attach second component 110 and light detecting component 106 to one another.

Referring to FIGS. 1, 4 and 5, and in an embodiment, second conductive terminal 124 of first mounting component 108 may include a jack 144. Printed circuit board 102 may form a first through hole 148. Jack 144 of first mounting component 108 and first through hole 146 may be sized for removable connection with one another. Second conductive terminal 124 of the first mounting component 108 may include a pair of jacks 148. Printed circuit board 102 may form a pair of second through holes 150. Jack 148 of second mounting component 110 and second through hole 150 may be sized for removable connection with one another.

Figure 6:
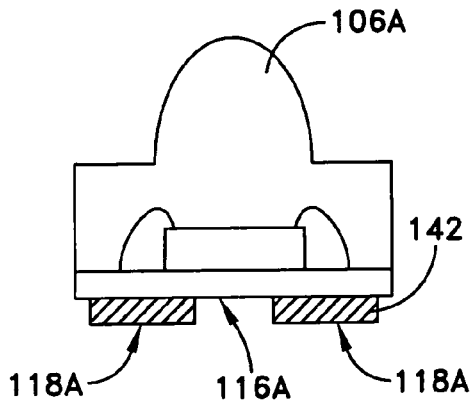
FIG. 6 illustrates a replacement light detecting component of the apparatus shown in FIG. 1.
Figure 7:
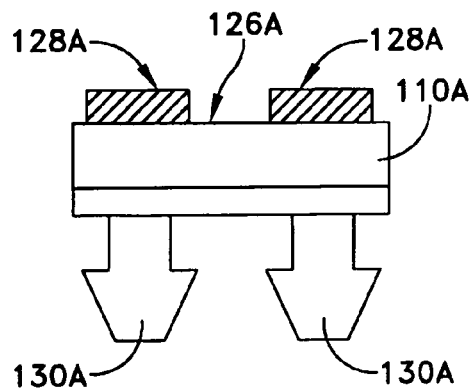
FIG. 7 illustrates a replacement mounting component of the apparatus shown in FIG. 1.

Referring to FIGS. 6 and 7, and in an embodiment, there is shown a replacement light detecting component 106A (FIG. 6) and a replacement mounting component 110A (FIG. 7). Looking at FIG. 6, replacement light detecting component 106A has an outer surface 116A with a pair of conductive terminals 118A.

Looking at FIGS. 1, 6 and 7, a replacement mounting component 110A (FIG. 7) may be provided for attaching replacement light detecting component 106A (FIG. 6) to printed circuit board 102 (FIG. 1) at the location of light detecting component 106 and second mounting component 110. Replacement mounting component 110A (FIG. 7) may have a surface 126A for attaching outer surface 116A of light detecting component 106A thereon. In an embodiment, replacement mounting component 110A may include a pair of first conductive terminals 128A and a pair of second conductive terminals 130A. First conductive terminals 128A may be configured for electrical connection with the conductive terminals 118A of replacement light detecting component 106A. Second conductive terminals 130A may be configured for removable connection with printed circuit board 102.

Light detecting component 106 may have a given resolution. Replacement light detecting component 106A may have a given resolution. In one embodiment, the given resolution of light detecting component 106 and the given resolution of replacement light detecting component 106A are different from one another. In another embodiment, the given resolution of light detecting component 106 and replacement light detecting component 106A are equal to one another.

Light detecting component 106 and replacement light detecting component 106A may each have a given resolution chosen from, for example, but not limited to, a value selected 75 LPI, 150 LPI, and 180 LPI.

Referring to FIG. 1, and in an embodiment, second terminal 124 of first mounting component 106 and second conductive terminal 130 of second mounting component 110 each form a removable connection to printed circuit board 102 at locations adjacent to one another. The locations of the removable connection of first mounting component 108 and the removable connection of second mounting component 110 are disposed on printed circuit board 102 to position outer surface 112 of the light emitting component 104 and outer surface 116 of light detecting component 106 in contact with one another.

Figure 8:
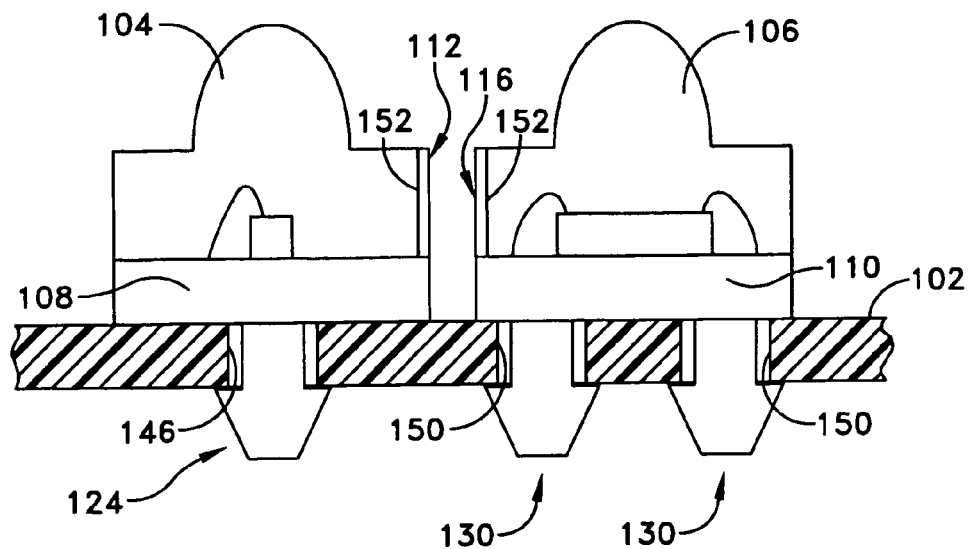
FIG. 8 illustrates an optical encoder apparatus mounted on a printed circuit board with a gap between the light emitting component and the light detecting component.

Looking at FIG. 8, and in an embodiment, the locations of the removable connection of first mounting component 108 and the removable connection of second mounting component 110 are disposed on printed circuit board 102 to position outer surface 112 of light emitting component 104 and outer surface 116 of light detecting component 106 separate from one another. For example, to position light emitting component 104 and light detecting component 116 with respect to one another, one or more of the position of through holes 146 and through holes 150, and the position of terminal 124 and terminal 130 may be adjusted.

Looking at FIGS. 1 and 8, and in one embodiment, there is shown an opaque region 152 on at least one of outer surface 112 of light emitting component 104 and outer surface 116 of light detecting component 106. Opaque region 152 is configured to limit direct light transfer from light emitting component 104 to light detecting component 106.

In one embodiment, opaque region 152 may include a roughed up portion of light emitting component 104. Opaque region 152 may include a roughed up portion of light detecting component 106. In another embodiment, opaque region 152 may include a material applied to light emitting component 104. Opaque region 152 may include a material applied to light detecting component 106.

Looking at FIG. 2, light emitting component 104 may have a domed region 154 to emit light. In one embodiment, a projection 156 may extend from light emitting component 104 to provide scratch protection to domed region 154.

Looking at FIG. 3, light detecting component 106 may have a domed region 158 to receive light. In an embodiment, a projection 160 may extend from light detecting component 106 to provide scratch protection to domed region 158.

Figure 9:
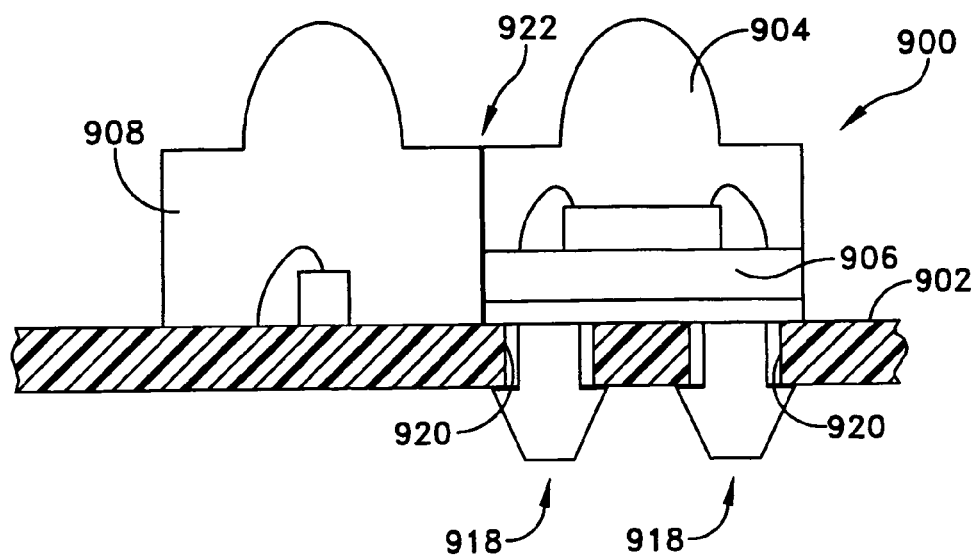
FIG. 9 illustrates one embodiment of an optical encoder apparatus having a light detecting component configured for removable connection with a printed circuit board.

Referring now to FIG. 9, and in an embodiment, there is provided optical encoder apparatus 900 for removable connection with a printed circuit board 902. In an embodiment, apparatus 900 may include a light detecting component 904, a mounting component 906, and a light emitting device 908.

Figure 10:
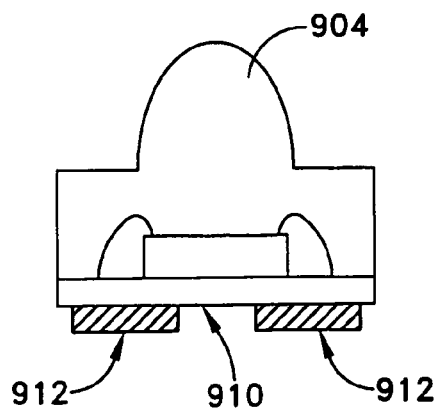
FIG. 10 illustrates a light detecting component of the apparatus shown in FIG. 9.

Looking at FIG. 10, there is shown light detecting component 904 having an outer surface 910 with a pair of conductive terminals 912.

Figure 11:
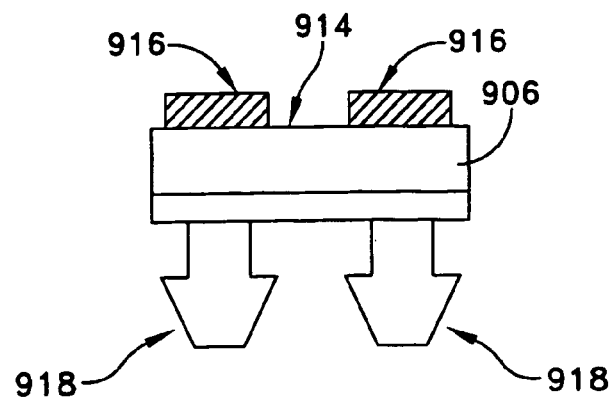
FIG. 11 illustrates a mounting component of the apparatus shown in FIG. 9.

Looking at FIG. 11, there is shown mounting component 906 having a surface 914 for attaching outer surface 910 of light detecting component 904 thereon. In an embodiment, mounting component 906 may include a first conductive terminal 916 and a second conductive terminal 918. First pair of conductive terminals 916 may be configured for electrical connection with conductive terminal 912 of light detecting component 904. Second conductive terminal 918 may be configured for removable connection with printed circuit board 902.

Light emitting device 908 may be in connection with printed circuit board 902 at a given location. In an embodiment, removable connection 918 of mounting component 906 is removably attached to printed circuit board 902 adjacent to the given location of light detecting component 904.

In one embodiment, second conductive terminal 918 of mounting component 906 may include a jack 918. Printed circuit board 802 may form a pair of through holes 920. Jack 918 and through hole 920 may be sized for removable connection with one another.

Figure 12:
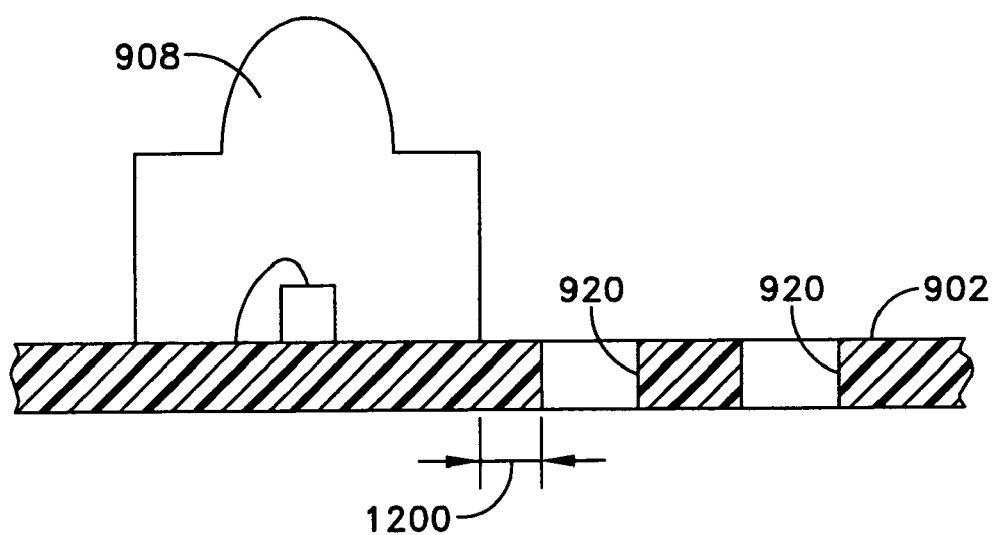
FIG. 12 illustrates an embodiment of a printed circuit board configured to position the light detecting component of FIG. 10 adjacent to the light emitting device.

Referring to FIG. 12, and in an embodiment, light emitting device 908 and through hole 920 are located a given distance 1200 from one another. Given distance 1200 may position light detecting component 904 in contact with light emitting device 908 at location 922 (FIG. 9) when mounting component 906 is attached to printed circuit board 902.

Figure 13:
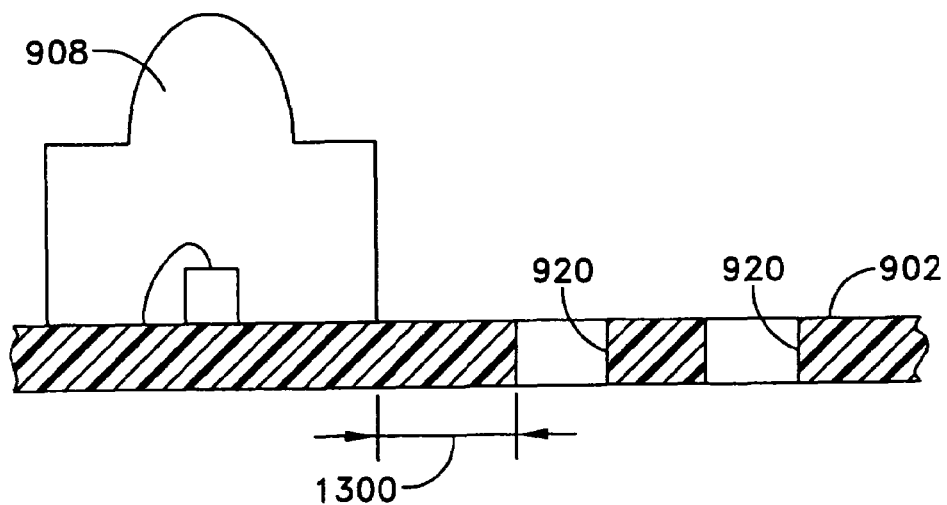
FIG. 13 illustrates another embodiment of a printed circuit board configured to position the light detecting component of FIG. 10 with a gap between the light emitting device.
Figure 14:
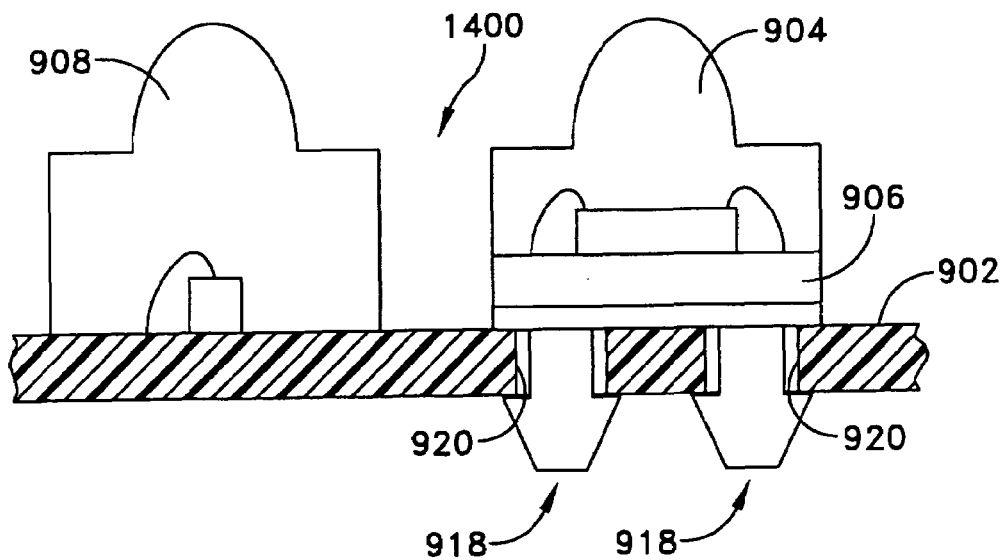
FIG. 14 illustrates the placement of the light detecting component of FIG. 10 on the printed circuit board of FIG. 13 with a gap between the light emitting device and the light detecting component.

Looking at FIGS. 13 and 14, and in one embodiment, light emitting device and through hole are located a given distance 1300 from one another (FIG. 13). Given distance 1300 may position light detecting component and light emitting device with a gap 1400 therebetween (FIG. 13) when mounting component 806 is attached to printed circuit board 802.

Figure 15:
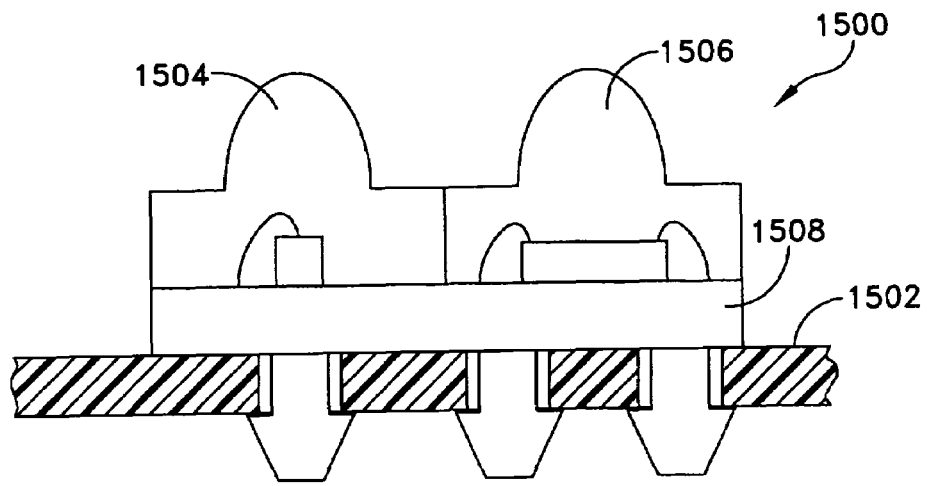
FIG. 15 illustrates one embodiment of an optical encoder apparatus having a light detecting component configured for removable connection with a printed circuit board.

Referring to FIG. 15, and in an embodiment, there is shown an optical encoder apparatus 1500 for removable connection with a printed circuit board 1502. In an embodiment, apparatus 1500 may include a light emitting component 1504, a light detecting component 1506, and a mounting component 1508.

Figure 16:
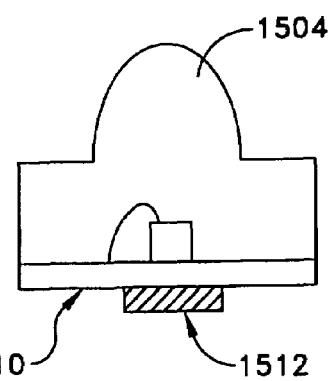
FIG. 16 illustrates a light emitting component of the apparatus shown in FIG. 15.

Looking at FIG. 16, and in an embodiment, light emitting component 1504 may include an outer surface 1510 with a conductive terminal 1512.

Figure 17:
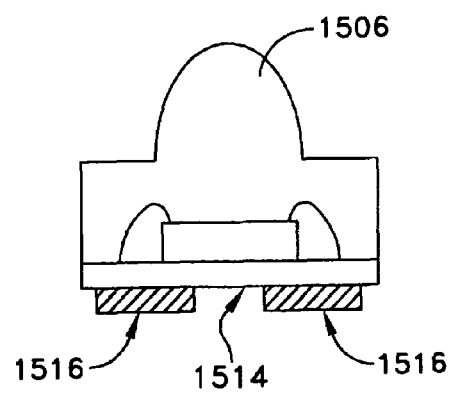
FIG. 17 illustrates a light detecting component of the apparatus shown in FIG. 15.

Looking at FIG. 17, and in one embodiment, light detecting component 1506 may include an outer surface 1514 with a pair of conductive terminals 1516.

Figure 18:
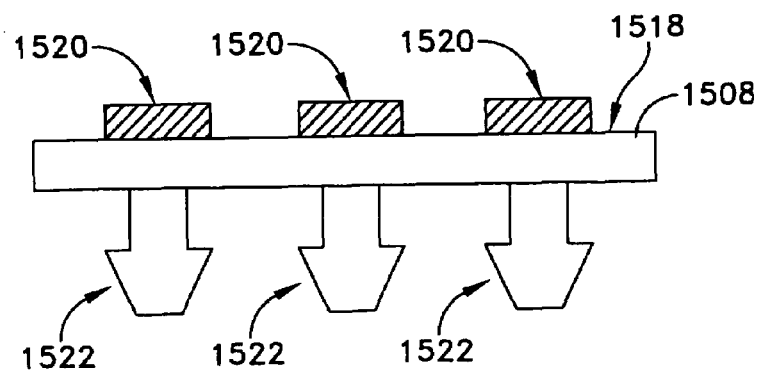
FIG. 18 illustrates a mounting component of the apparatus shown in FIG. 15.

Looking at FIG. 18, and in an embodiment, mounting component 1508 may include a surface 1518 for attaching outer surface 1510 of light emitting component 1504 and outer surface 1514 of light detecting component 1506 thereon. Mounting component 1508 may include a first set of conductive terminals 1520 and a second set of conductive terminals 1522. First set of conductive terminals 1520 may be configured for electrical connection with conductive terminal 1512 of light emitting component 1504 and with conductive terminal 1516 of light emitting component 1504. Second set of conductive terminals 1522 may be configured for removable connection with printed circuit board 1502.

Figure 19:
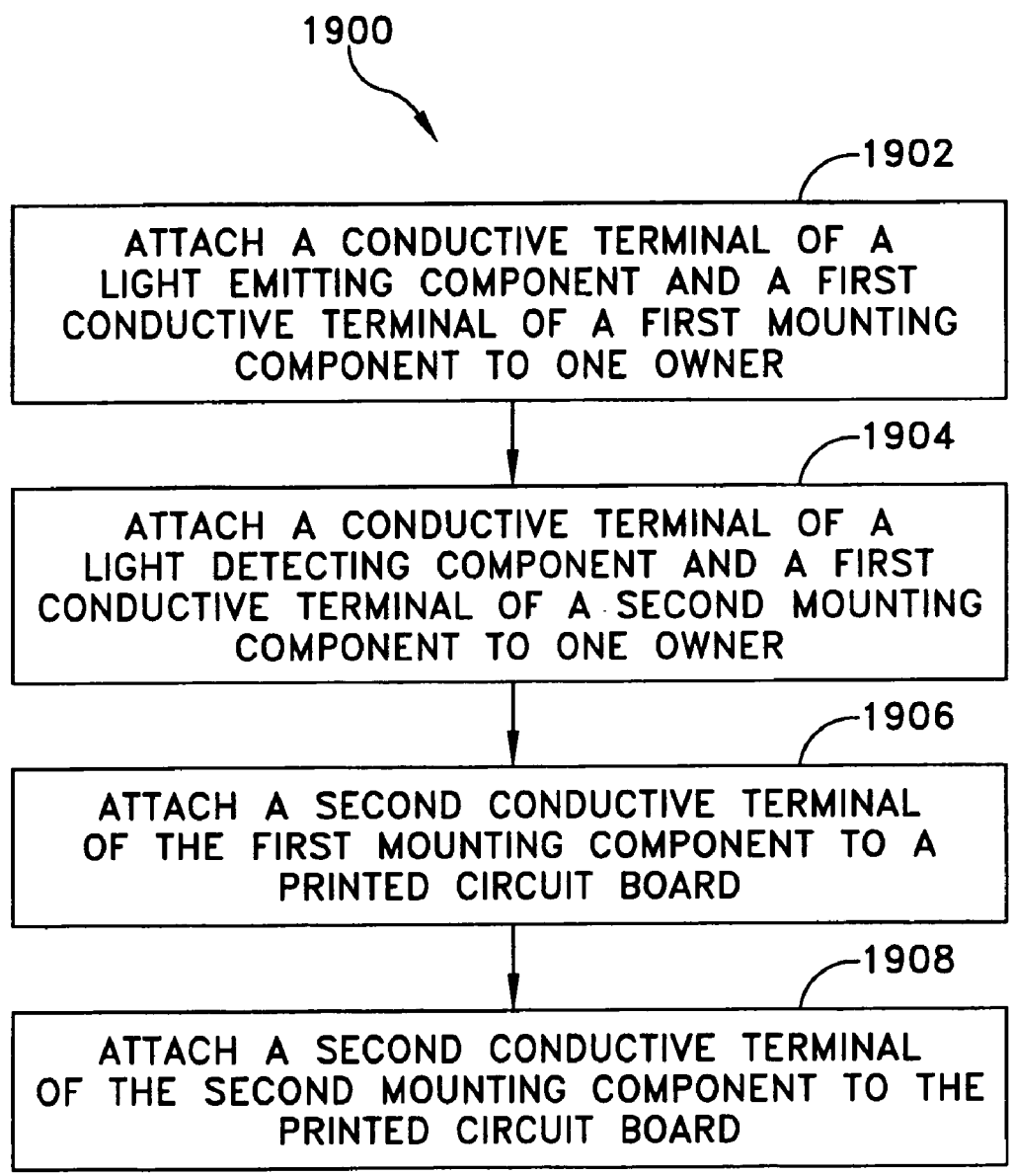
FIGS. 19-22 are flow chart diagrams for various methods of assembling optical encoder apparatus.

Looking at FIG. 19, there is shown optical encoder apparatus 1900 for removable connection with a printed circuit board 1902. In an embodiment, apparatus 1900 may include a light emitting component 1904, a light detecting component 1906, and a mounting component 1908.

Referring to FIG. 19, and in an embodiment, there is shown a method 1900 of assembling optical encoder apparatus. Method 1900 may include attaching 1902 a conductive terminal of a light emitting component and a first conductive terminal of a first mounting component to one another. Method 1900 may include attaching 1904 a conductive terminal of a light detecting component and a first conductive terminal of a second mounting component to one another. Method 1900 may include attaching 1906 a second conductive terminal of the first mounting component to a printed circuit board. Method 1900 may include attaching 1908 a second conductive terminal of the second mounting component to the printed circuit board.

Figure 20:
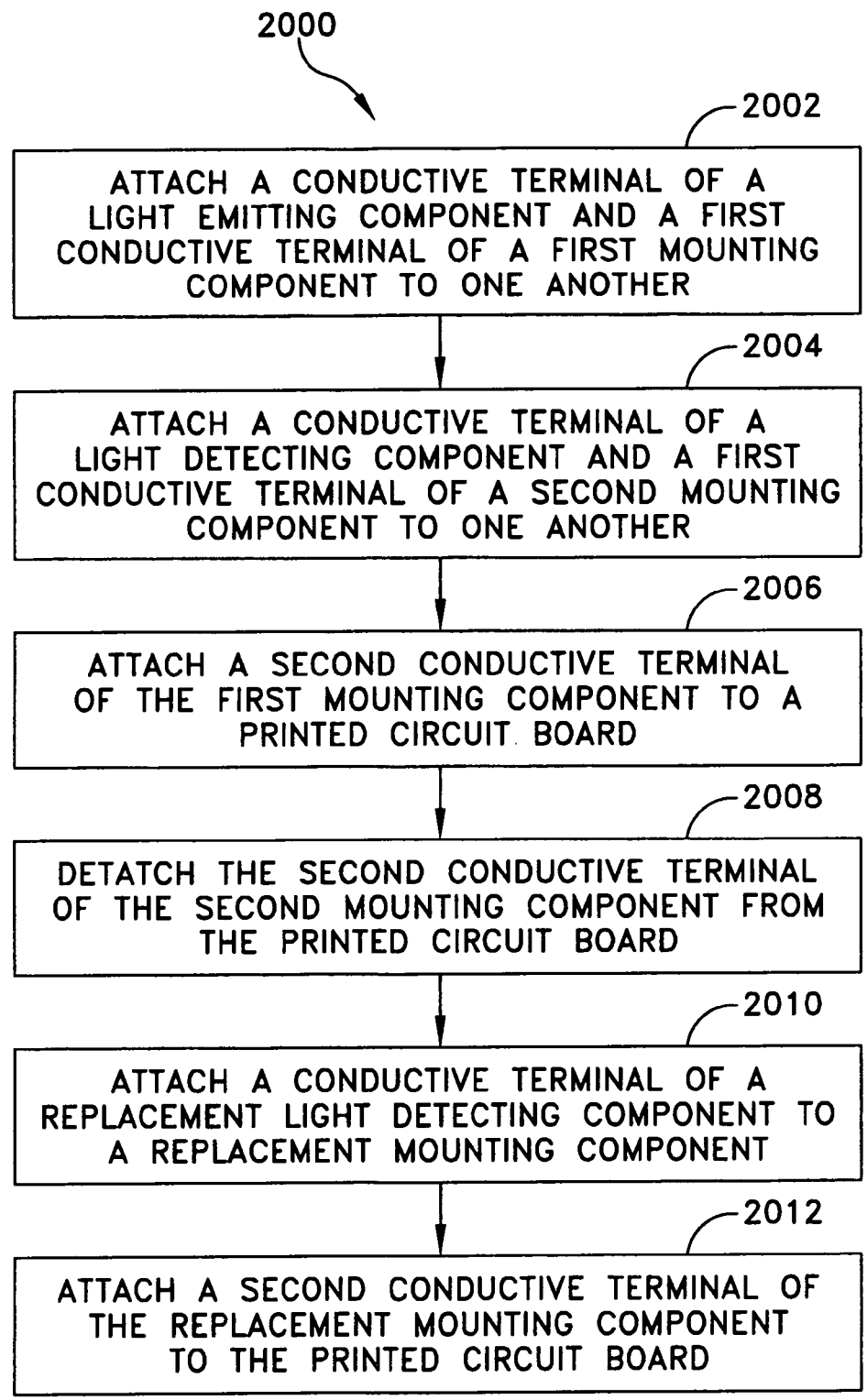

Referring to FIG. 20, and in an embodiment, there is shown a method 2000 of assembling optical encoder apparatus. Method 2000 may include attaching 2002 a conductive terminal of a light emitting component and a first conductive terminal of a first mounting component to one another. Method 2000 may include attaching 2004 a conductive terminal of a light detecting component and a first conductive terminal of a second mounting component to one another. Method 2000 may include attaching 2006 a second conductive terminal of the first mounting component to a printed circuit board. Method 2000 may include attaching 2008 a second conductive terminal of the second mounting component to the printed circuit board. Method 2000 may include detaching 2010 the second conductive terminal of the second mounting component from the circuit board. Method 2000 may include attaching 2012 a conductive terminal of a replacement light detecting component to a replacement mounting component. Method 2000 may include attaching 2014 a second conductive terminal of the replacement mounting component to the printed circuit board.

In an embodiment, method 2000 may include selecting the light detecting component and replacement light detecting component to have different resolutions from one another.

Figure 21:
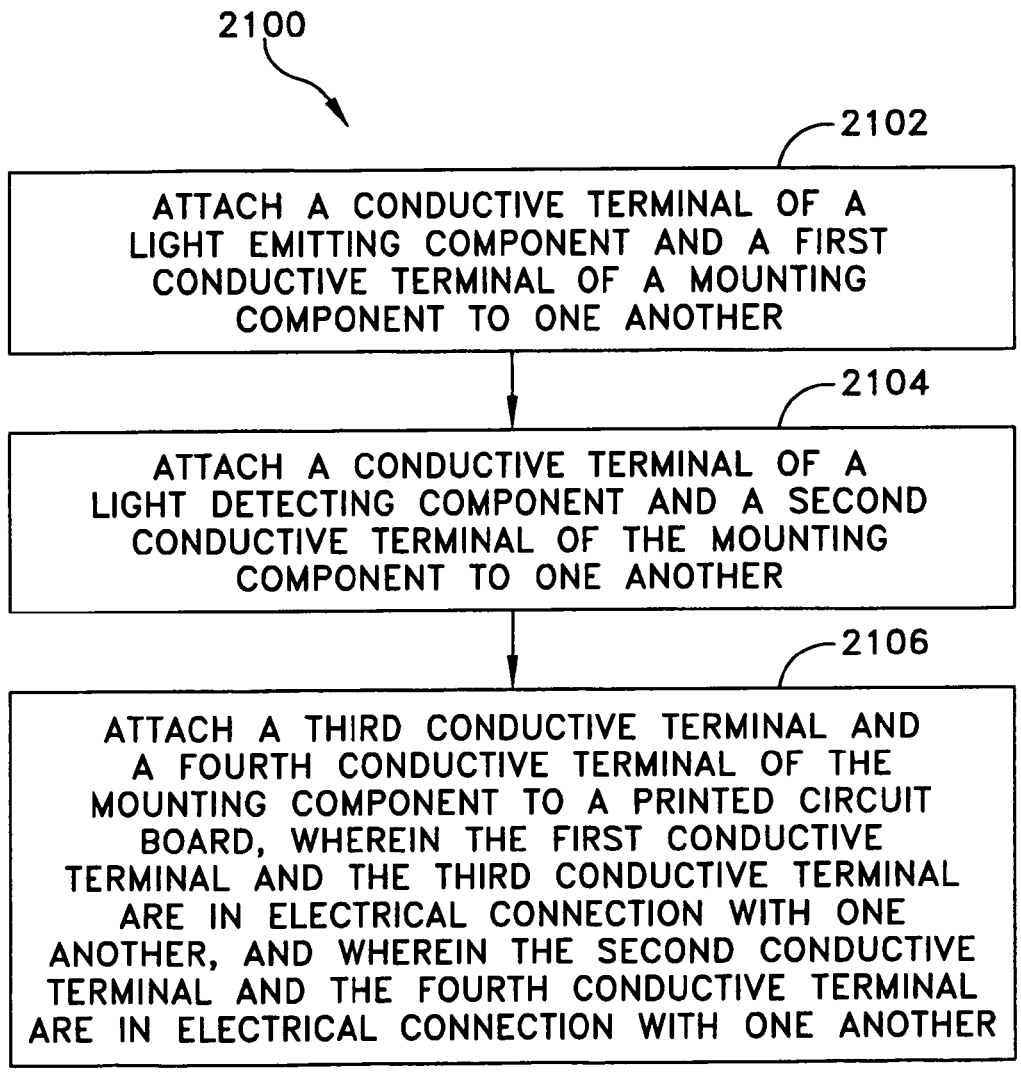

Referring to FIG. 21, there is shown a method 2100 of assembling optical encoder apparatus. In an embodiment, method 2100 may include attaching 2102 a conductive terminal of a light emitting component and a first conductive terminal of a mounting component to one another. Method 2100 may include attaching 2104 a conductive terminal of a light detecting component and a second conductive terminal of the mounting component to one another. Method 2100 may include attaching 2106 a third conductive terminal and a fourth conductive terminal of the mounting component to a printed circuit board, wherein the first conductive terminal and the third conductive terminal are in electrical connection with one another, and wherein the second conductive terminal and the fourth conductive terminal are in electrical connection with one another.

Figure 22:
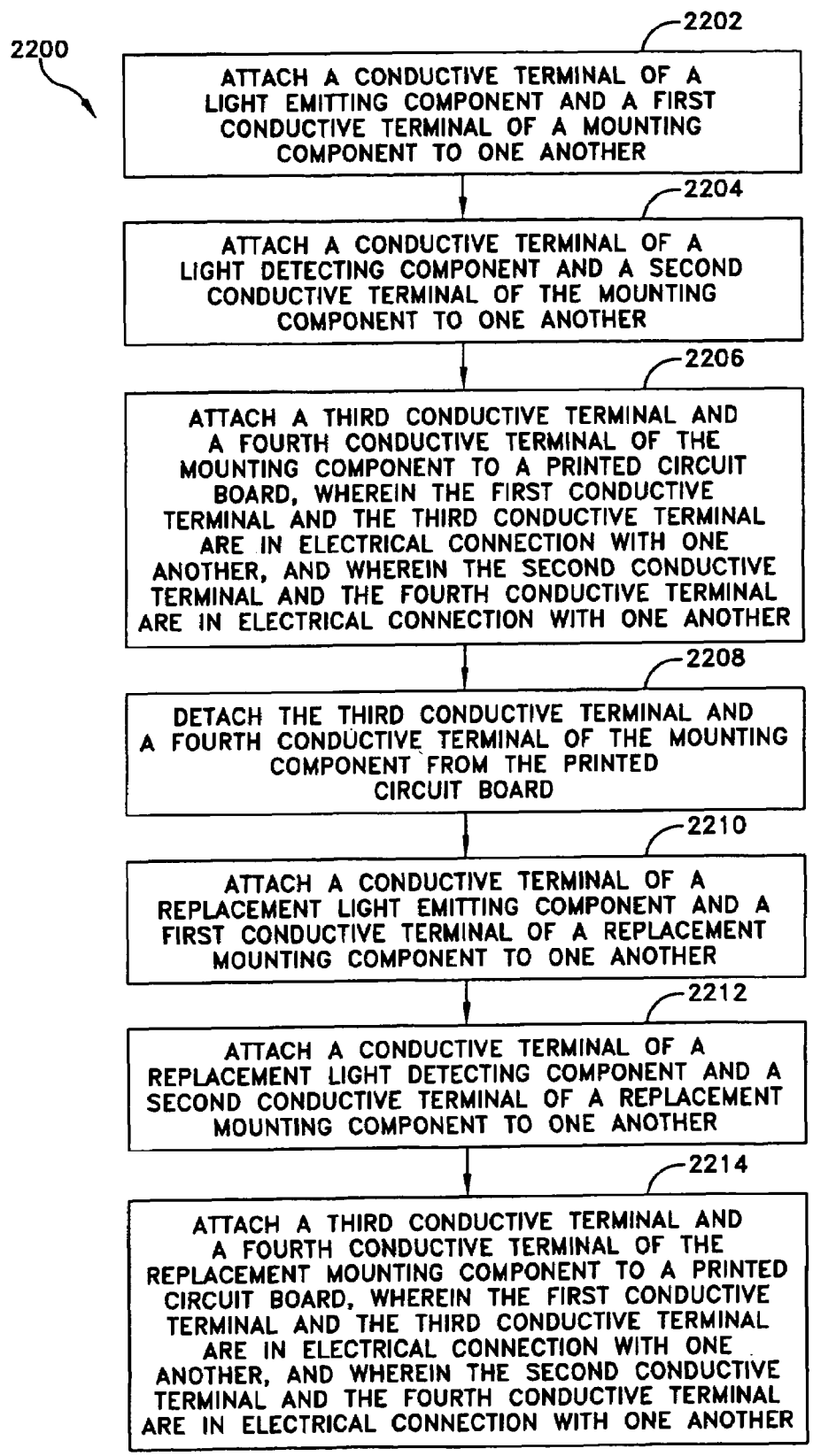

Referring to FIG. 22, there is shown a method 2200 of assembling optical encoder apparatus. In an embodiment, method 2200 may include attaching 2202 a conductive terminal of a light emitting component and a first conductive terminal of a mounting component to one another. Method 2200 may include attaching 2204 a conductive terminal of a light detecting component and a second conductive terminal of the mounting component to one another. Method 2200 may include attaching 2206 a third conductive terminal and a fourth conductive terminal of the mounting component to a printed circuit board, wherein the first conductive terminal and the third conductive terminal are in electrical connection with one another, and wherein the second conductive terminal and the fourth conductive terminal are in electrical connection with one another. Method 2200 may include detaching 2208 the third conductive terminal and a fourth conductive terminal of the mounting component from the printed circuit board. Method 2200 may include attaching 2210 a conductive terminal of a replacement light emitting component and a first conductive terminal of a replacement mounting component to one another. Method 2200 may include attaching 2212 a conductive terminal of a replacement light detecting component and a second conductive terminal of the replacement mounting component to one another. Method 2200 may include attaching 2214 a third conductive terminal and a fourth conductive terminal of the replacement mounting component to a printed circuit board, wherein the first conductive terminal and the third conductive terminal are in electrical connection with one another, and wherein the second conductive terminal and the fourth conductive terminal are in electrical connection with one another.

What is claimed is:

1. Optical encoder apparatus for removable connection with a printed circuit board, the apparatus comprising:
   a light emitting component having an outer surface with a conductive terminal;
   a light detecting component having an outer surface with a conductive terminal;
   a first mounting component having a surface for attaching the outer surface of the light emitting component thereon, a first conductive terminal for electrical connection with the conductive terminal of the light emitting component, and a second conductive terminal for removable connection with the printed circuit board; and
   a second mounting component having a surface for attaching the outer surface of the light detecting component thereon, a first conductive terminal for electrical connection with the conductive terminal of the light detecting component, and a second conductive terminal for removable connection with the printed circuit board.

2. Apparatus in accordance with claim 1, wherein the light emitting component comprises a light emitting diode.

3. Apparatus in accordance with claim 2, wherein the outer surface of the light emitting component is a modular component containing the light emitting diode.

4. Apparatus in accordance with claim 1, wherein the light detecting component comprises a photodiode.

5. Apparatus in accordance with claim 1, wherein the outer surface of the light detecting component is a modular component containing the photodiode.

6. Apparatus in accordance with claim 1, wherein the first mounting component and the second mounting component are each separate modular components from the light emitting component and the light detecting component, respectively.

7. Apparatus in accordance with claim 1, wherein the second conductive terminal of the first mounting component comprises a jack, the printed circuit board forms a first through hole, the jack of the first mounting component and the first through hole are sized for removable connection with one another, and wherein the second conductive terminal of the second mounting component comprises a jack, the printed circuit board forms a second through hole, the jack of the second mounting component and the second through hole are sized for removable connection with one another.

8. Apparatus in accordance with claim 1, further comprising a replacement light detecting component and a replacement mounting component, wherein the replacement light detecting component has an outer surface with a conductive terminal, wherein the replacement mounting component is configured for attaching the replacement light detecting component to printed circuit board, wherein the replacement light detecting component has a surface for attaching the outer surface of light detecting component thereon, the replacement mounting component includes a first conductive terminal and a second conductive terminal, the first conductive terminal ins configured for electrical connection with the conductive terminal of the replacement light detecting component, and the second conductive terminal is configured for removable connection with the printed circuit board.

9. Apparatus in accordance with claim 8, wherein the light detecting component has a given resolution, the replacement light detecting component has a given resolution, and the given resolution of the light detecting component and the given resolution of the replacement light detecting component are different from one another.

10. Apparatus in accordance with claim 8, wherein the light detecting component has a given resolution, the replacement light detecting component has a given resolution, and the given resolution of the light detecting component and the given resolution of the replacement light detecting component are equal to one another.

11. Apparatus in accordance with claim 1, wherein the second terminal of the first mounting component and the second conductive terminal of the second mounting component each form a removable connection to the printed circuit board at locations adjacent to one another.

12. Apparatus in accordance with claim 11, wherein the locations of the removable connection of the first mounting component and the removable connection of the second mounting component are disposed on the printed circuit board to position the outer surface of the light emitting component and the outer surface of the light detecting component in contact with one another.

13. Apparatus in accordance with claim 11, wherein the locations of the removable connection of the first mounting component and the removable connection of the second mounting component are disposed on the printed circuit board to position the outer surface of the light emitting component and the outer surface of the light detecting component separate from one another.

14. Apparatus in accordance with claim 1, further comprising an opaque region on at least one of the outer surface of the light emitting component and the outer surface of the light detecting component so as to limit direct light transfer from the light emitting component to the light detecting component.

15. Apparatus in accordance with claim 14, wherein the opaque region comprises at least one selected from the group consisting of a roughed up portion of the light emitting component, and a roughed up portion of the tight detecting component.

16. Apparatus in accordance with claim 14, wherein the opaque region comprises at least one selected from the group consisting of a material applied to the light emitting component, and a material applied to the tight detecting component.

17. Apparatus in accordance with claim 1, wherein the light emitting component has a domed region to emit light, wherein a projection extends from the light emitting component to provide scratch protection to the domed region thereof, wherein the light detecting component has a domed region to receive light, and wherein a projection extends from the light detecting component to provide scratch protection to the domed region thereof.

18. A method of assembling optical encoder apparatus, the method comprising:
  attaching a conductive terminal of a light emitting component and a first conductive terminal of a first mounting component to one another
  attaching a conductive terminal of a light detecting component and a first conductive terminal of a second mounting component to one another;
  attaching a second conductive terminal of the first mounting component to a printed circuit board; and
  attaching a second conductive terminal of the second mounting component to the printed circuit board.

19. A method in accordance with claim 18, further comprising detaching the second conductive terminal of the second mounting component from the circuit board, attaching a conductive terminal of a replacement light detecting component to a replacement mounting component, and attaching a second conductive terminal of the replacement mounting component to the printed circuit board.

20. A method in accordance with claim 19, further comprising selecting the light detecting component and replacement light detecting component to have different resolutions from one another.

* * * * *

UNITED STATES PATENT AND TRADEMARK OFFICE
CERTIFICATE OF CORRECTION

PATENT NO. : 7,439,487 B2
APPLICATION NO. : 11/394611
DATED : October 21, 2008
INVENTOR(S) : Premkumar S. Ramachandran et al.

It is certified that error appears in the above-identified patent and that said Letters Patent is hereby corrected as shown below:

Title Pg, Item (54) Title: delete "APPARATUS." and insert -- APPARATUS --;

Title Pg, Item (75) (Inventors:) delete "Saifulbahari Saidan" and insert -- Saiful Bahari Saidan --;

Column 1, Line 5, delete "APPARATUS." and insert -- APPARATUS --;

Column 9, Line 1, Claim 8, delete "ins" and insert -- is --;

Column 10, Line 4, Claim 15, delete "tight" and insert -- light --;

Column 10, Line 9, Claim 16, delete "tight" and insert -- light --;

Column 10, Line 22, Claim 18, delete "another" and insert -- another; --.

Signed and Sealed this

Fifteenth Day of June, 2010

David J. Kappos
*Director of the United States Patent and Trademark Office*